United States Patent
Supriya et al.

(10) Patent No.: US 7,651,021 B2
(45) Date of Patent: Jan. 26, 2010

(54) MICROBALL ATTACHMENT USING SELF-ASSEMBLY FOR SUBSTRATE BUMPING

(75) Inventors: Lakshmi Supriya, Chandler, AZ (US); Ravi Nalla, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 32 days.

(21) Appl. No.: 11/966,943

(22) Filed: Dec. 28, 2007

(65) Prior Publication Data

US 2009/0166396 A1    Jul. 2, 2009

(51) Int. Cl.
  *B23K 31/02* (2006.01)
(52) U.S. Cl. ............... 228/180.22; 228/246; 228/248.1
(58) Field of Classification Search .................. None
  See application file for complete search history.

(56) References Cited

U.S. PATENT DOCUMENTS

| | | | | |
|---|---|---|---|---|
| 5,846,366 | A * | 12/1998 | Jin et al. | 156/233 |
| 7,407,081 | B2 * | 8/2008 | Rice et al. | 228/8 |
| 7,494,913 | B2 | 2/2009 | Jomaa et al. | 438/613 |
| 2001/0023139 | A1 * | 9/2001 | Jiang et al. | 439/66 |
| 2005/0199995 | A1 * | 9/2005 | Nomoto et al. | 257/692 |
| 2005/0232728 | A1 * | 10/2005 | Rice et al. | 414/217 |
| 2007/0269973 | A1 | 11/2007 | Nalla et al. | 438/12 |
| 2008/0003804 | A1 | 1/2008 | Nalla et al. | 438/613 |
| 2008/0070349 | A1 | 3/2008 | Matayabas et al. | 438/121 |
| 2008/0283387 | A1 * | 11/2008 | Rice et al. | 204/192.1 |
| 2009/0072012 | A1 * | 3/2009 | Sakaguchi et al. | 228/246 |
| 2009/0085206 | A1 | 4/2009 | Bchir et al. | 257/738 |
| 2009/0087644 | A1 | 4/2009 | Supriya et al. | 428/327 |

FOREIGN PATENT DOCUMENTS

JP          10229090      *  8/1998

OTHER PUBLICATIONS

Stix, G., "Pour Me Another", Sci. Am., 00368733, vol. 284, Issue 3, (Mar. 2001).
Clark et al., "Template-Directed Self-Assembly of 10-μm-Sized Hexagonal Plates", J. Am. Chem. Soc., vol. 124, No. 19 (2002) pp. 5419-5426.
Smith et al., "Electric-field assisted assembly and alignment of metallic nanowires", Appl. Phys. Lett., vol. 77, No. 9 (Aug. 28, 2000), pp. 1399-1401.
Terfort et al., "Three-dimensional self-assembly of millimeter-scale components", Nature, vol. 386, No. 13, (Mar. 13, 1977), pp. 162-164.

* cited by examiner

*Primary Examiner*—Kiley Stoner
(74) *Attorney, Agent, or Firm*—Konrad Raynes & Victor LLP; Alan S. Raynes

(57) ABSTRACT

Electronic devices and methods for fabricating electronic devices are described. One method includes providing a substrate with a plurality of bonding pads thereon, and providing a plurality of solder microballs, the microballs including a coating thereon. The method also includes flowing the solder microballs onto the substrate and positioning the solder microballs on the bonding pads. The method also includes heating the solder microballs to reflow and form a joint between the solder microballs and the bonding pads. Other embodiments are described and claimed.

20 Claims, 4 Drawing Sheets

MICROBALL ATTACHMENT USING SELF-ASSEMBLY FOR SUBSTRATE BUMPING

RELATED ART

Integrated circuits may be formed on semiconductor wafers made of materials such as silicon. The semiconductor wafers are processed to form various electronic devices. The wafers are diced into semiconductor chips (a chip is also known as a die), which may then be attached to a substrate using a variety of known methods. For example, bonding pads formed on the chip may be electrically coupled to the substrate using a variety of connection approaches, including, for example, those utilizing solder bumps.

In one type of die attach process, a die is mounted to a substrate using a conventional solder bump array in a flip chip configuration, using a method known as a C4 (controlled collapse chip connection) process, in which solder bumps are located between the die and substrate. In a C4 process, solder paste may be placed on pads on the active side of the die, on the substrate, or on both the die and substrate, using, for example, stencil mask printing. The solder is then melted and permitted to flow, to ensure that each bump fully wets the pad it was formed on. A flux may then be applied to at least one of the surfaces to be joined and the surfaces on the die and substrate are brought into contact through the solder bumps. A second reflow operation is then carried out, and a solder connection is made between the die pads and the substrate pads. The joined package is then cooled to complete the solder bump joint.

BRIEF DESCRIPTION OF THE DRAWINGS

Embodiments are described by way of example, with reference to the accompanying drawings, which are not drawn to scale, wherein.

DETAILED DESCRIPTION

Figure 1A:
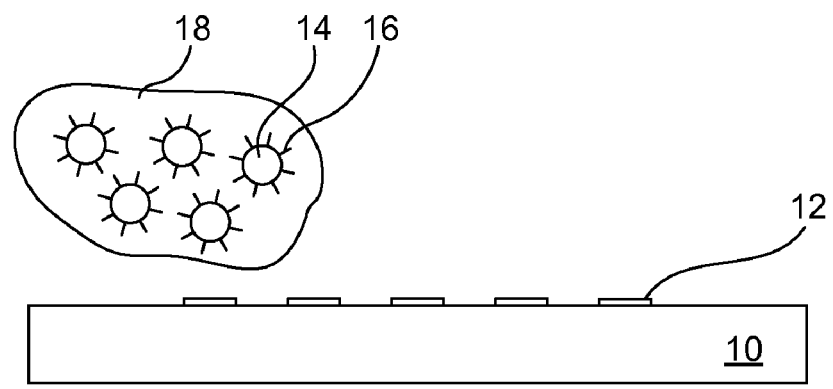
FIGS. 1(A)-1(D) illustrate views of a processing operations in which microballs are coupled to bonding pads on a substrate and a body is attached to the microballs on the substrate, in accordance with certain embodiments.

Stencil mask printing technology currently used for C4 bumping of substrates is limited in its application to high density interconnect substrates of electronic packages, due to the requirements of decreasing C4 solder pitch and bump sizes. For example, stencil mask printing at ultra-fine pitches of less than or equal to 150 microns leads to poor yields, with problems including, but not necessarily limited to, mask lift-off, missing bumps, and low volume solder bumps.

Certain embodiments relate to the formation of assemblies in which microballs are attached to bonding pads on a body such as a substrate. Another body such as a semiconductor die may be coupled to the substrate through the microballs. Embodiments may include methods and devices. The microballs may be formed to include a surface coating thereon, and the coating may be formed from a material that causes the microballs to be attracted to the bonding pads. The attraction may be due to at least one of chemical, magnetic, and electrostatic interactions. An additional force may also be present to assist in the direction of the microballs to the bonding pads. The force may include, but is not limited to, one or more of an electric field, a magnetic field, and fluid forces such as capillary force.

FIGS. 1(A)-1(D) illustrate the formation of an assembly that includes the attachment of solder microballs 14 to bonding pads 12 on a body such as a substrate 10, in accordance with certain embodiments. While they may be formed as spheres, it is not necessary that the solder microballs 14 be spherical in shape. In certain embodiments, the solder microballs 14 may have an average diameter of about 150 microns or less. The size of the solder microballs may be selected to be less than the pad to pad distance between adjacent bonding pads. The solder may be any suitable solder material, such as, for example, low melting point metals. The term metals as used herein includes pure metals and alloys. Examples of suitable alloys include, but are not limited to, Sn—Pb (tin-lead), Sn—Ag (tin-silver), and Sn—Ag—Cu (tin-silver-copper) alloys. The solder microballs 14 may include a surface coating 16. The coating 16 may include one or more materials, including, but not limited to, silanes and thiols. The coating 16 may act to form a surface functionalization on the solder microballs 14. The coating 16 introduces functional groups (e.g., end groups) onto the surface of the solder microballs 14. The functional groups may be selected so that they have an affinity for the bonding pad 12. For example, if the bonding pad 12 is formed from a metal comprising copper (Cu), then a material having an end group including sulfur (S) is an example of a material that may be used as a coating material 16 for the solder microballs 14, because certain sulfur end groups tend have an affinity for metals such as copper, gold, silver, platinum, palladium, and the like, which may be used as bonding pad materials. The solder microballs 14 may optionally be cleaned or surface treated (e.g., plasma or acid cleaning) prior to attachment.

The solder microballs 14 may be dispersed in a liquid 18 and be flowed onto surface of the substrate 10 having the bonding pads 12 thereon. The solder microballs 14 may be flowed in the presence of some agitation to inhibit agglomeration. The liquid 18 may be any suitable liquid into which the microballs may be dispersed, for example, water, ethanol, or other suitable solvent. The liquid 18 may also include a flux, so that an additional fluxing operation is not required. Excess solder microballs 14 and liquid 18 may be collected and reused.

Figure 1B:
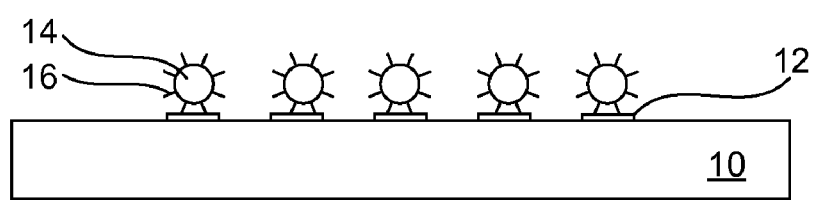
Figure 1C:
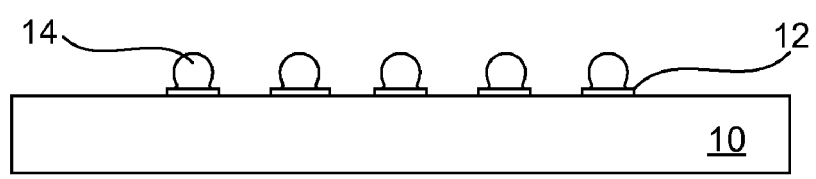
Figure 1D:
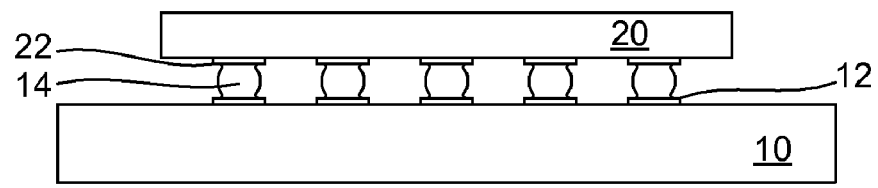

As illustrated in FIG. 1(B), the coating 16 has an affinity for the bonding pad material and thus the microballs 14 are attracted to the bonding pads 12 and readily position themselves thereon. Once the solder microballs 14 are positioned on the bonding pads 12 through the coating 16, heat is applied to reflow the solder and form a strong joint between the solder microballs 16 and the bonding pads 12, as illustrated in FIG. 1(C). The coating 16 may be formed from a material (or materials) that will decompose during the reflow heating operation, which enhances the formation of a good joint. A body 20, such as a semiconductor die, including bonding pads 22, may then be aligned with and positioned on the reflowed solder microballs 14, and then the solder microballs 14 are again heated to reflow and join the body 20 to the substrate 10 through the solder microballs 14, as illustrated in FIG. 1(D).

Examples of suitable coatings that provide surface functionalization of the microballs include materials having end groups including, but are not limited to, thiol (—SH), amine (—NH$_2$), disulfide (—S—S—), and carboxyl (—COOH) end groups. Examples of coating materials including thiol end groups include, but are not limited to, mercaptoethanol, and mercaptosilanes such as 3-mercaptopropyltrimethyl silane. Examples of materials including amine end groups include, but are not limited to, aminosilanes such as 3-aminopropyltrimethoxy silane. Examples of materials including disulfide end groups include, but are not limited to, alkanedisulfides ($C_nH_{2n}S_2$, n=1, 2, 3 . . . ).

The coating material may be applied using any suitable method, including, but not limited to, immersion coating, and spraying. In certain embodiments the coating may be no greater than about 5 microns.

Figure 2A:
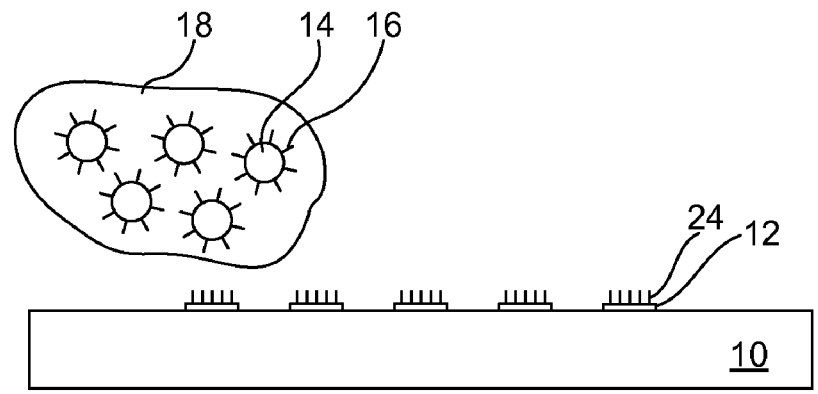
FIGS. 2(A)-2(B) illustrate views of microballs being coupled to coated bonding pads on a substrate, in accordance with certain embodiments.
Figure 2B:
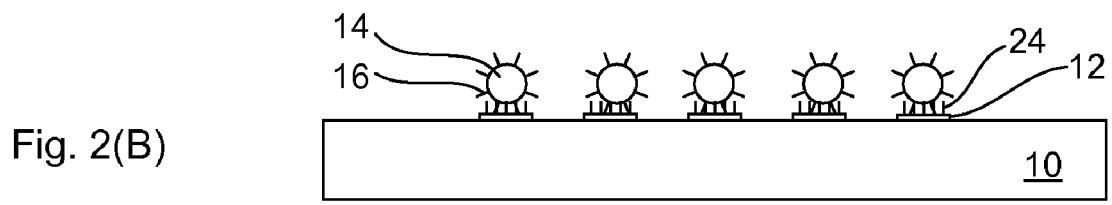

Certain embodiments may also include the formation of a surface coating on the bonding pads. FIGS. 2(A)-2(B) illustrate bonding pads 12 that include a surface functionalization coating 24 thereon. The coating 24 is formed from a material that shows an affinity for the solder microballs 14 that include the surface coating 16. The selection of the exact coating 24 material may be dependent on the material used for any surface coating on the solder microballs. The shape of the coatings as illustrated in various Figures herein is for illustrative purposes only and not to be interpreted in a limiting manner.

FIG. 2(B) illustrates the solder microballs 14 including coating 16, coupled to bonding pad 12 including coating 24 thereon. In one such example, the bonding pads 12 may include a coating 24 comprising carboxyl-terminated silanes, and the solder microballs 14 may include a coating 16 comprising an amino-terminated silane. The solder microballs 14 will position themselves on the bonding pads due to the chemical affinity of the coating 16 on the solder microballs 14 to the coating 24 on the bonding pads 12.

Embodiments may also include microballs that do not include a functionalization coating thereon, coupled to bonding pads including a functionalization coating thereon.

Figure 3A:
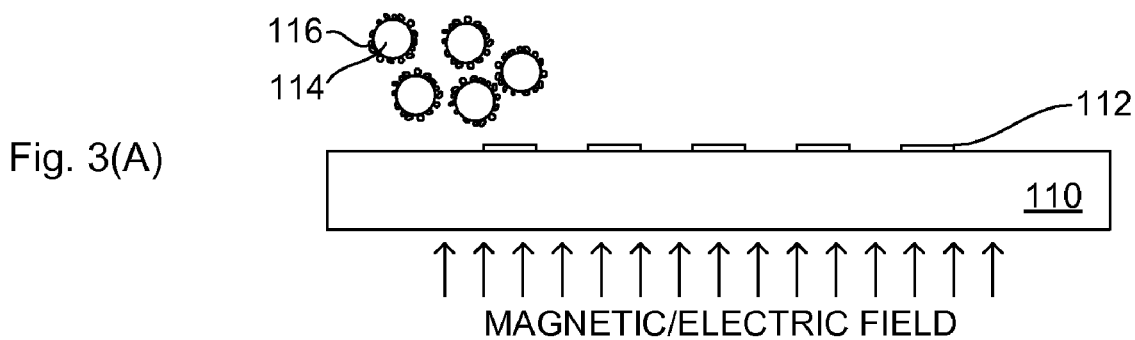
FIGS. 3(A)-3(B) illustrate views of microballs being coupled to bonding pads on a substrate, in the presence of a field selected from magnetic fields and electric fields, in accordance with certain embodiments.
Figure 3B:
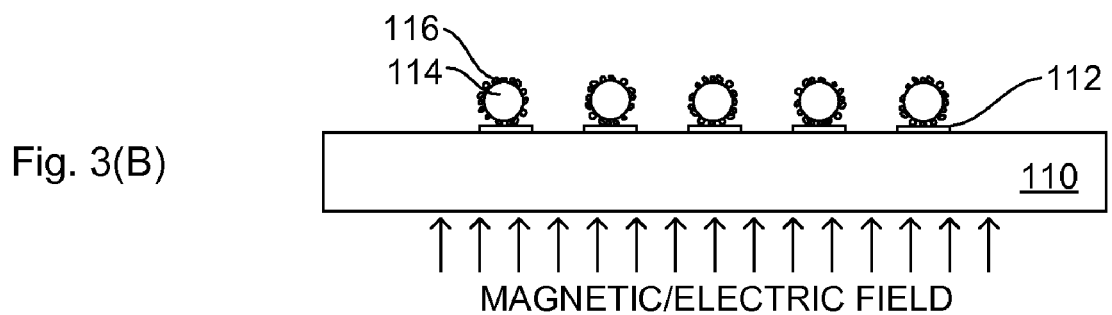

Certain embodiments may utilize a magnetic coating material on the microballs, including, but not limited to, magnetic nanoparticles. FIG. 3(A) illustrates solder microballs 114 including a coating 116 comprising magnetic particles, positioned over a substrate 110 having bonding pads 112 formed from a suitable material such as a metal. The magnetic particles in the coating 116 may, for example, comprise core-shell type materials having a core of magnetic nanoparticles selected from the group including, but not limited to, $Fe_2O_3$, FeCo, Fe, and Ni. In certain embodiments the bonding pads 112 may include a similar coating layer to the coating 116 on the solder microballs 114. In other embodiments the bonding pads 112 do not include such a coating layer. The solder microballs 114 including the coating 116 are flowed over the surface of the substrate 110 in the presence of a magnetic field. The solder microballs 114 may be flowed over the surface of the substrate 110 in neat form (not dispersed in fluid), as illustrated in FIG. 3(A), or may be dispersed in a fluid in a manner similar to that of the solder microballs 14 described above in connection with FIG. 1(A). As a result of the magnetic field presence, the solder microballs 114 are attracted to and directed to assemble on the bonding pads 112, as illustrated in FIG. 3(B).

The solder microballs 114 may also be flowed over the substrate 110 in the presence of an electric field. When the bonding pads 112 are formed from a suitable metal, the metal pads will be activated by the electric field to become magnetic, and thus the solder microballs 114 including the coating 116 will be attracted thereto and will assemble on the bonding pads 112, as illustrated in FIG. 3(B). The presence of an electric field may also result in electrostatic attraction.

Figure 4A:
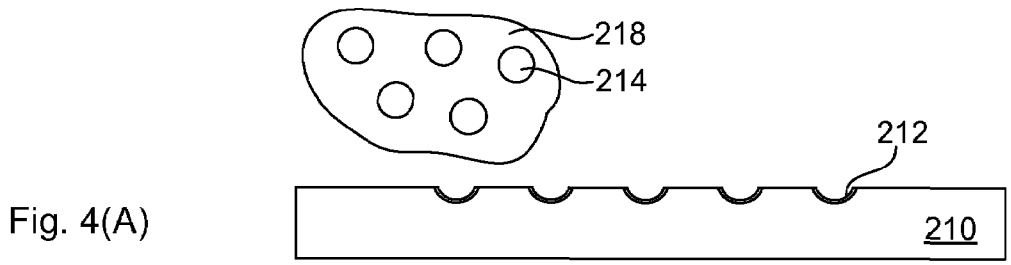
FIGS. 4(A)-4(B) illustrate views of microballs being coupled to recessed bonding pads on a substrate, in accordance with certain embodiments.
Figure 4B:
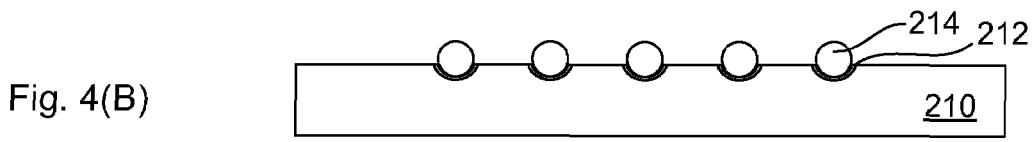

FIGS. 4(A)-4(B) illustrates an embodiment in which a substrate 210 includes bonding pads 212 that are recessed in shape. The recess in the bonding pads 212 are sized to accept a portion of a solder microballs 214 therein. The solder microballs 214 may include a coating or be uncoated, and may be dispersed in a fluid 218. The fluid 218 may include at least one of a flux and a solvent. Upon application to the surface of the substrate 210, the solder microballs 214 will fit into the recesses in the bonding pads 212, as illustrated in FIG. 4(B).

Figure 5:
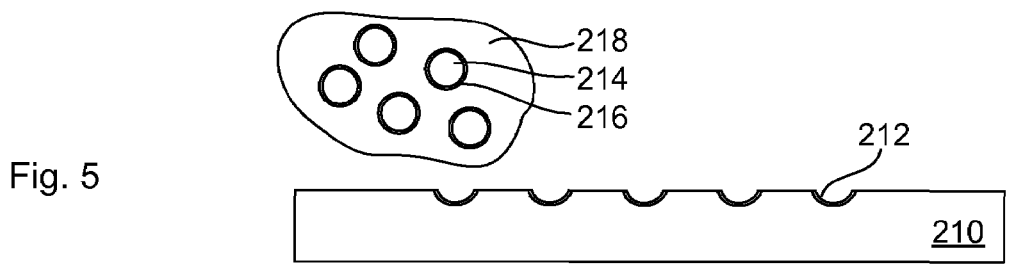
FIG. 5 illustrates a view of microballs being positioned over a substrate including recessed bonding pads, in accordance with certain embodiments.

FIG. 5 illustrates an embodiment similar to that illustrated in FIGS. 4(A)-4(B), with recessed bonding pads 212. In FIG. 5, the solder microballs 214 include a coating 216 that is a flux. By precoating the solder microballs 214 with the flux, the inclusion of a flux in the liquid 218, or a separate fluxing operation, is not necessary.

Figure 6:
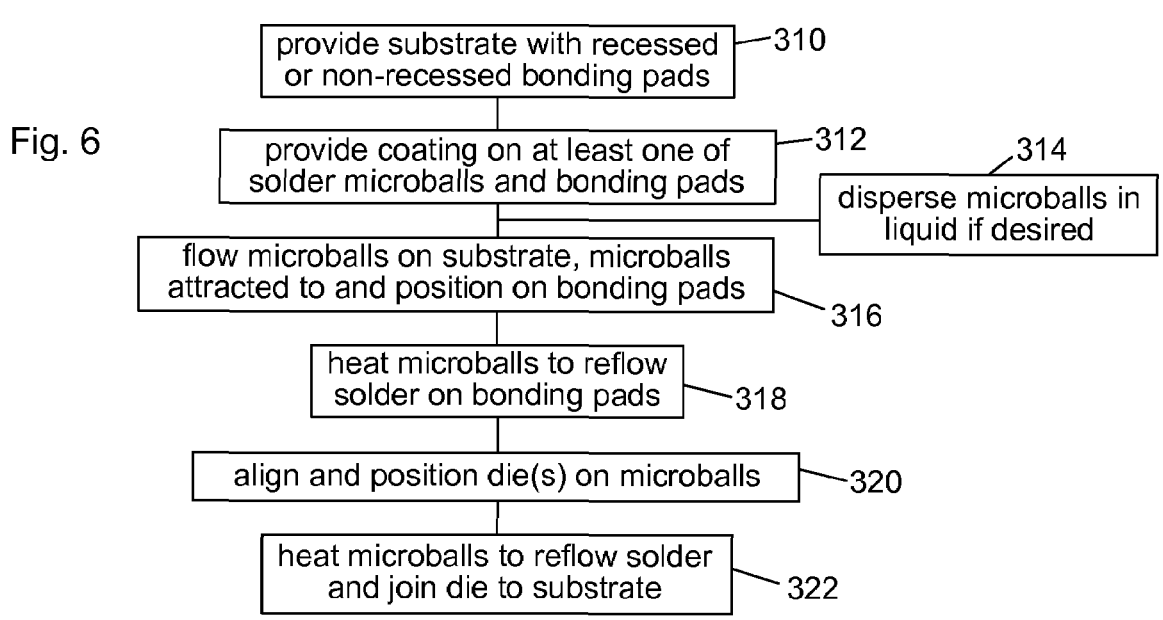
FIG. 6 illustrates a flow chart of an assembly process utilizing microballs that are coupled to bonding pads on a substrate, in accordance with certain embodiments.

FIG. 6 illustrates a flowchart of operations to an assembly, in accordance with certain embodiments. Box 310 is providing a body such as a substrate having a plurality of metal bonding pads that may be recessed or not recessed in structure, as desired. Examples of bonding pad materials include, but are not limited to, copper (Cu), and copper with a coating of nickel (Ni) and gold (Au). An example of a recessed bonding pad structure 212 is illustrated in FIG. 4(A). Box 312 is providing a coating on at least one of solder microballs and the bonding pads. The coating may be a functionalization coating such as described above. Box 314 is dispersing the solder microballs in a liquid, if desired.

Box 316 is flowing the solder microballs on the substrate, wherein at least some of the microballs will interact with and position themselves on the bonding pads through the coating. In one example of an embodiment with functionalization coatings on the solder microballs and the bonding pads, a functionalization coating on the solder microballs may be selected from disulfides and alkoxysilanes, and the functionalization coating on the bonding pads may include carboxyl-terminated silanes, which will be attracted to the amines, etc. of the microball functionalization coating. Alternatively, the coating materials on the solder microballs and the bonding pads may be reversed. In another example, including coated solder microballs and uncoated metal bonding pads, the solder microballs may include a functionalization coating including sulfide and/or amino end groups. The affinity of the sulfide and/or amino end groups for the metal in the bonding pads will direct the assembly of the microballs to the bonding pads. If the solder microballs are dispersed in a liquid and then flowed over the bonding pads on the substrate, any excess liquid and solder microballs may be collected and reused.

Box 318 is heating the solder microballs positioned on the bonding pads to reflow the solder and form a good bond between the solder microballs and the bonding pad. In certain embodiments, the functionalization coating(s) are decomposed during the heating operation. Box 320 is aligning the substrate and at least one body such as a semiconductor die to be attached thereto through the solder microballs. The die may include bonding pads that are positioned on the solder microballs. Box 322 is heating the solder microballs again to reflow the solder and form an assembly including the at least one die joined to the substrate through the solder microballs.

Figure 7:
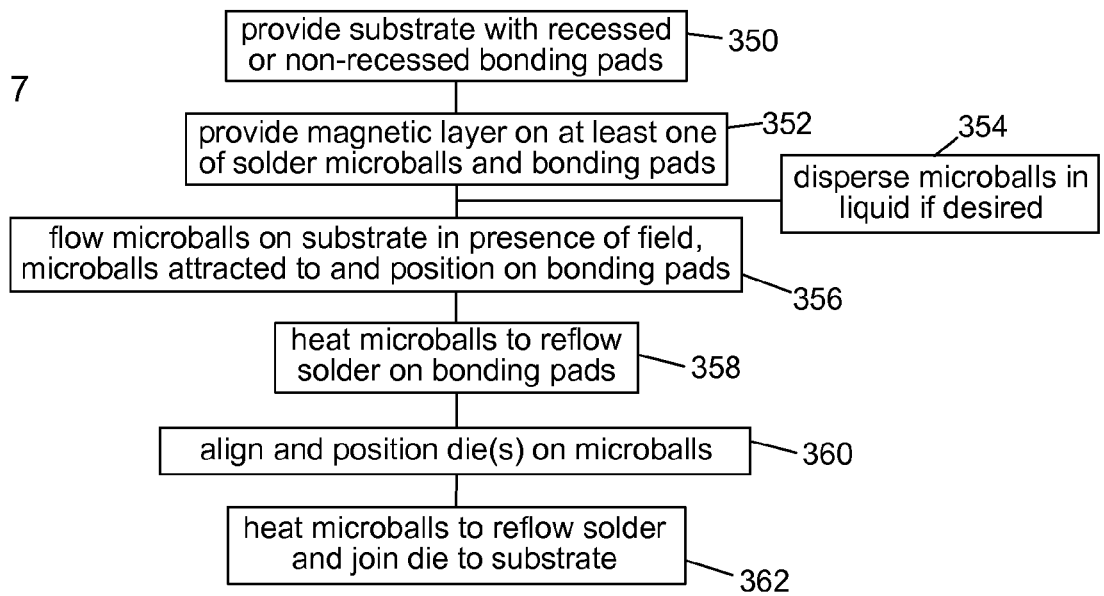
FIG. 7 illustrates a flow chart of an assembly process utilizing microballs that are coupled to bonding pads on a substrate, in the presence of a field selected from magnetic fields and electric fields, in accordance with certain embodiments.
Figure 8:
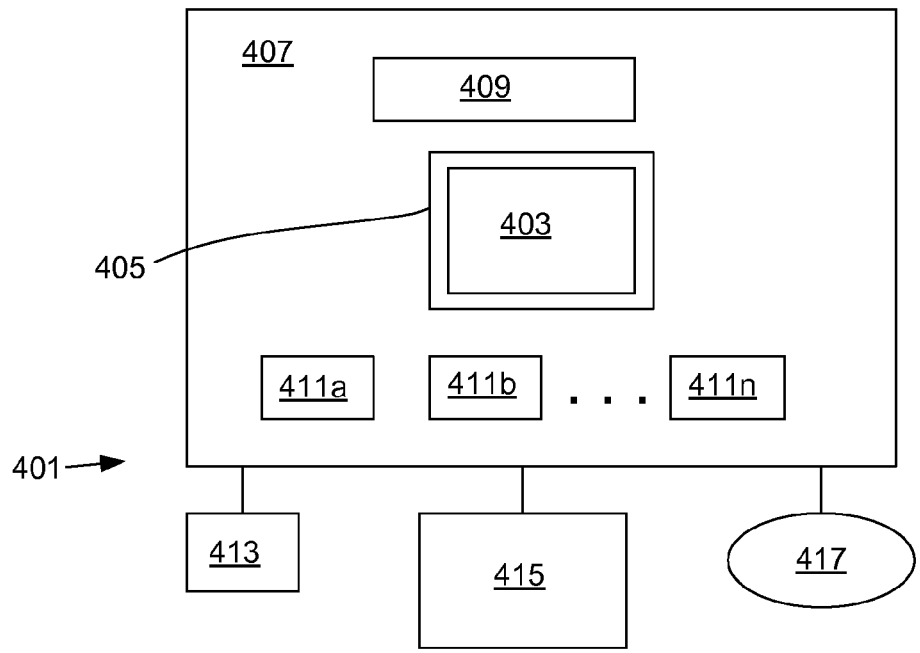
FIG. 8 illustrates an electronic system arrangement in which embodiments may find application.

FIG. 7 illustrates another flowchart of operations to form an assembly, in accordance with certain embodiments, in which magnetic particles are used as a surface coating on at least one of solder microballs and bonding pads. Box 350 is providing a substrate having a plurality of metal bonding pads that may be recessed or not recessed in structure, as desired.

Box 352 is providing a magnetic layer on at least one of the solder microballs and the bonding pads, the layer including magnetic nanoparticles. Box 354 is dispersing the solder microballs in a liquid, if desired. Box 356 is flowing the solder microballs on the substrate and applying a field selected from at least one of a magnetic field and an electric field to the bonding pads and the solder microballs. At least some of the solder microballs are attracted to and position themselves on the bonding pads through the magnetic particles of the coating.

Box 358 is heating the solder microballs positioned on the bonding pads to reflow the solder and form a good bond between the solder microballs and the bonding pad. Box 360 is aligning the substrate and at least one die to be attached thereto through the solder microballs. The die may include bonding pads positioned on the solder microballs. Box 362 is heating the solder microballs again to reflow the solder and form an assembly including the at least one die joined to the substrate through the solder microballs. Various modifications and additions to the above operations in both FIGS. 6 and 7 may be made. For example, when being flowed over the bonding pads on the substrate, the solder microballs may be flowed in the presence of some agitation to inhibit agglomeration of the solder microballs. In addition, a flux may be incorporated into the coating on the solder microballs in certain embodiments, in order to remove the need for a separate application of flux operation.

As described above, in certain embodiments, the coating on the solder microballs and/or on the bonding pads may comprise a material that when coated on at least one of the solder microballs and bonding pads, causes the solder microballs to be attracted to the bonding pads due to at least one interaction selected from the group consisting of chemical, magnetic, and electrostatic interactions. Embodiments such as those described above enable the formation of bump bonding at ultra-fine pitches, for example, less than 150 microns, using solder microballs that are positioned on bonding pads using surface functionalization coating(s) that provide an attraction that acts to self assemble the microballs to the bonding pads. Other processing techniques, such as screening microballs through a stencil, or vacuum head placement to deliver microballs to the bonding pads, may result in poor yields, with problems including microballs missing from intended locations, which leads to the need for careful, time consuming inspection and re-work operations.

It should be noted that recessed bonding pad structures such as the bonding pads 212 illustrated in FIG. 4(A) may be used in various other embodiments described and illustrated herein. Furthermore, in certain embodiments, either one or both of the solder microballs and the bonding pads may include a coating such as those described above. Furthermore, in various embodiments, the solder microballs may be delivered to the substrate either dispersed in a liquid or in a neat state. In addition, it should be appreciated that in embodiments where the microballs are first coupled to a body such as a substrate and then coupled to a body such as a die, the order could be reversed, with the microballs being first coupled to a die, and then to a substrate.

Assemblies including bodies such as substrates and die structures joined together using microballs as described in embodiments above may find application in a variety of electronic components. FIG. 7 schematically illustrates one example of an electronic system environment in which aspects of described embodiments may be embodied. Other embodiments need not include all of the features specified in FIG. 7, and may include alternative features not specified in FIG. 7.

The system 401 of FIG. 7 may include at least one central processing unit (CPU) 403. The CPU 403, also referred to as a microprocessor, may be a die which is attached to an integrated circuit package substrate 405, which is then coupled to a printed circuit board 407, which in this embodiment, may be a motherboard. The CPU 403 on the package substrate 405 is an example of an electronic device assembly that may be formed in accordance with embodiments such as described above. A variety of other system components, including, but not limited to memory and other components discussed below, may also include die and substrate structures formed in accordance with the embodiments described above.

The system 401 may further include memory 409 and one or more controllers 411a, 411b . . . 411n, which are also disposed on the motherboard 407. The motherboard 407 may be a single layer or multi-layered board which has a plurality of conductive lines that provide communication between the circuits in the package 405 and other components mounted to the board 407. Alternatively, one or more of the CPU 403, memory 409 and controllers 411a, 411b . . . 411n may be disposed on other cards such as daughter cards or expansion cards. The CPU 403, memory 409 and controllers 411a, 411b . . . 411n may each be seated in individual sockets or may be connected directly to a printed circuit board. A display 415 may also be included.

Any suitable operating system and various applications execute on the CPU 403 and reside in the memory 409. The content residing in memory 409 may be cached in accordance with known caching techniques. Programs and data in memory 409 may be swapped into storage 413 as part of memory management operations. The system 401 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 411a, 411b . . . 411n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 413 in accordance with a storage protocol layer. The storage protocol of the layer may be any of a number of known storage protocols. Data being written to or read from the storage 413 may be cached in accordance with known caching techniques. A network controller can include one or more protocol layers to send and receive network packets to and from remote devices over a network 417. The network 417 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
providing a body with a plurality of bonding pads thereon;
providing a plurality of solder microballs, the solder microballs including a coating thereon;

flowing the solder microballs onto the body and positioning at least some of the solder microballs on the bonding pads; and heating the solder microballs on the bonding pads to reflow and form a joint between the solder microballs and the bonding pads;

wherein the coating on the solder microballs comprises a magnetic material, and wherein the positioning the solder microballs on the bonding pads comprises applying a field selected from the group consisting of a magnetic field and an electric field, to attract the magnetic material on the solder microballs towards the bonding pads.

2. The method of claim 1, wherein the solder microballs have a diameter of no greater than 150 microns.

3. The method of claim 1, further comprising dispersing the solder microballs in a liquid, and wherein the flowing the solder microballs onto the body comprises flowing the liquid including the solder microballs onto the body.

4. The method of claim 1, further comprising forming a recess in the bonding pads, the recess sized to accept at least a portion of a solder microball therein.

5. The method of claim 1, wherein the coating on the solder microballs further comprises a material having an end group selected from the group consisting of thiol, amine, disulfide, and carboxyl.

6. The method of claim 1, wherein the coating on the solder microballs further comprises a flux material.

7. The method of claim 1, further comprising forming a magnetic coating on the bonding pads.

8. The method of claim 1, wherein adjacent bonding pads on the body are spaced no greater than 150 microns apart from each other.

9. The method of claim 1, wherein the field comprises a magnetic field.

10. A method comprising:
providing a body with a plurality of bonding pads thereon;
providing a plurality of solder microballs, the solder microballs including a coating thereon;
flowing the solder microballs onto the body and positioning at least some of the solder microballs on the bonding pads; and
heating the solder microballs on the bonding pads to reflow and form a joint between the solder microballs and the bonding pads;
wherein the coating on the solder microballs comprises magnetic nanoparticles, and wherein the positioning the solder microballs on the bonding pads comprises applying a field selected from the group consisting of a magnetic field and an electric field, to attract the magnetic nanoparticles in the coating on the solder microballs towards the bonding pads.

11. The method of claim 10, wherein the field comprises a magnetic field.

12. A method comprising:
providing a body with a plurality of bonding pads;
providing a plurality of solder microballs;
providing a coating on at least one of the group selected from the solder microballs and the bonding pads;
flowing the solder microballs onto the body and coupling at least some of the solder microballs to the bonding pads; and
heating the solder microballs to reflow and form a joint between the solder microballs and the bonding pads;
wherein the coating comprises a material that when coated on at least one of the solder microballs and bonding pads, causes the solder microballs to be attracted to the bonding pads due to at least one interaction selected from the group consisting of chemical, magnetic, and electrostatic interactions; and
wherein the coating on at least one of the group selected from the solder microballs and the bonding pads comprises a magnetic material.

13. The method of claim 12, wherein the coating on at least one of the group selected from the solder microballs and the bonding pads further comprises a material having an end group selected from the group consisting of thiol, amine, disulfide, and carboxyl.

14. The method of claim 12, wherein the solder microballs and the bonding pads are provided with the coating.

15. The method of claim 12, wherein the interaction comprises a magnetic field.

16. The method of claim 12, wherein the coating on the bonding pads comprises a magnetic material.

17. A method comprising:
providing a body with a plurality of bonding pads thereon;
providing a plurality of solder microballs, the solder microballs including a coating thereon, the coating comprising a magnetic material; and
positioning at least some of the solder microballs on the bonding pads, wherein the positioning at least some of the solder microballs on the bonding pads comprises applying a field selected from the group consisting of a magnetic field and an electric field, to attract the magnetic material on the solder microballs towards the bonding pads.

18. The method of claim 17, wherein the field comprises a magnetic field.

19. The method of claim 17, wherein the field comprises an electric field.

20. The method of claim 17, wherein the bonding pads include a magnetic coating thereon.

* * * * *